United States Patent
Bunce et al.

(10) Patent No.: US 7,210,084 B2
(45) Date of Patent: Apr. 24, 2007

(54) INTEGRATED SYSTEM LOGIC AND ABIST DATA COMPRESSION FOR AN SRAM DIRECTORY

(75) Inventors: Paul A. Bunce, Poughkeepsie, NY (US); John D. Davis, Maybrook, NY (US); Thomas J. Knips, Wappingers Falls, NY (US); Donald Plass, Pleasant Valley, NY (US)

(73) Assignee: International Business Machines Corporation, Armonk, NY (US)

( * ) Notice: Subject to any disclaimer, the term of this patent is extended or adjusted under 35 U.S.C. 154(b) by 51 days.

(21) Appl. No.: 10/413,612

(22) Filed: Apr. 14, 2003

(65) Prior Publication Data

US 2004/0205434 A1   Oct. 14, 2004

(51) Int. Cl.
*G11C 29/30* (2006.01)
*G11C 29/24* (2006.01)

(52) U.S. Cl. ................... 714/733; 714/763; 714/718
(58) Field of Classification Search ............... 714/733, 714/763, 718, 724; 365/200, 201
See application file for complete search history.

(56) References Cited

U.S. PATENT DOCUMENTS

2001/0026483 A1* 10/2001 Hasegawa et al. .......... 365/200
2002/0194545 A1* 12/2002 Abbott ........................ 714/42
2003/0051197 A1*  3/2003 Evans ........................ 714/718

* cited by examiner

*Primary Examiner*—Albert Decady
*Assistant Examiner*—Dipakkumar Gandhi
(74) *Attorney, Agent, or Firm*—Lynn L. Augspurger; Richard M. Goldman

(57) ABSTRACT

ABIST apparatus with integrated directory compare logic functionality, and ABIST error detection functionality. The apparatus includes two subsystems NOR'ed together. The first subsystem is for bit-wise logically ANDing corresponding array valid bits and tag valid inputs, generating "0" for a match and "1" for a mis-match, and logically ORing the bit-wise result to generate a "1" hit if there are any bit-wise mismatches. The second subsystem further receives ABIST control logic as an input to either: (a). combine array valid bits tag valid inputs to produce valid output, or (b) compare array valid bits with tag valid inputs. The apparatus further includes logical NOR functionality for the outputs of the first and second subsystems.

5 Claims, 2 Drawing Sheets

INTEGRATED SYSTEM LOGIC AND ABIST DATA COMPRESSION FOR AN SRAM DIRECTORY

FIELD OF THE INVENTION

The invention described herein relates to array built in self testers for random access memory arrays.

BACKGROUND OF THE INVENTION

In order to test RAM macros, e.g., SRAM directory macros, by means of Array Built In Self Test (ABIST), the data from the array is usually compared to expected data. To accomplish this, the ABIST requires additional circuitry. This additional circuitry is either embedded in the SRAM or provided in surrounding logic.

Directory macro's are microprocessor cache components that are used to determine if a particular address is currently held in the main cache RAM. Typically, a directory RAM holds a portion of the addresses stored in the main cache RAM. A portion of the full address is used to retrieve and latch an entry from the RAM. Another portion of the address ("tag") is then compared against the latched entry from the RAM. If the tag matches the entry retrieved from the RAM, the cache is said to have found a "hit".

Typically, the logic to accomplish this utilizes RAM output to generate a "hit" signal. A set of bits from the RAM are compared bit by bit with the corresponding tag bits using an XOR gate. The output of any XOR is a "1" if the corresponding RAM bit and tag bit are mismatched, that is, the tag bit and the RAM bit are not equal to each other. If, however, none of the XOR gates generate a mismatch, that is, all of the RAM bits are equal to the corresponding tag bits, then the output of a second stage NOR gate will be a "1", meaning that the cache found a hit. The speed at which the cache can operate is directly affected by how long it takes for this compare structure to evaluate the inputs. This, in turn, depends upon the length of the logic path.

A clear need exists to reduce the length and complexity of the logic path, and thereby reduce the time required for the cache to operate.

There is also a clear need to reduce the circuit overhead of the directory compare and logic function and the ABIST error detection function.

OBJECTS OF THE INVENTION

It is a primary object of the invention to integrate the directory compare and logic function with the ABIST error detection function.

It is a further object of the invention to reduce circuit overhead associated with the directory compare and logic function and the ABIST error detection function.

It is still a further object of the invention to reduce the length and complexity of the logic path, and thereby reduce the time delay associated with cache operations.

SUMMARY OF THE INVENTION

These and other objects are achieved by the method and apparatus of the invention described herein.

Specifically, the apparatus of the invention integrates the directory compare and logic function with the ABIST error detection function. This is done for the purpose of reducing the circuit overhead associated with the directory compare and logic function and the ABIST error detection function. This is accomplished by judicious reduction of the length and complexity of the logic path, and thereby reducing the time delay (that is, increasing the speed) at which the cache can operate.

The apparatus of the invention provides a built-in, on-chip test system for testing a memory array for array and tag data. The apparatus includes two subsystems NOR'ed together. The first subsystem is for bit-wise logically XORing corresponding array compare bits and tag address inputs, generating "0" for a match and "1" for a mis-match, and logically ORing the bit-wise result to generate a "1" result if there are any bit-wise mismatches. The second subsystem further receives ABIST control logic as an input to either: (a). combine array valid bits tag valid inputs to produce valid output, or (b) compare array valid bits with tag valid inputs. The apparatus further includes logical NOR functionality for the outputs of the first and second subsystems.

When the apparatus is in the ABIST mode the tag valid inputs are orthogonal, and the system produces "don't care" states.

The apparatus implements the defined valid logic as (V0U0+V1U1), and the implemented valid logic is ((V0+NOT (U0)) (V1+NOT (U1)) (U0+U1)) where V0 and V1 are array valid bits and U0 and U1 are tag valid inputs.

This invention is used to implement an n-bit compare and x-bit valid logic function for an SRAM directory macro. The ABIST control signal changes the function to an (n+x)–compare function for ABIST error detection.

THE FIGURES

Various embodiments and exemplifications of the invention are illustrated in the Figures appended hereto.

DETAILED DESCRIPTION OF THE INVENTION

In a preferred embodiment, the apparatus of the invention is used to implement an n-bit compare and x-bit valid logic function for an SRAM directory macro. The ABIST control signal changes the function to an (n+x)—compare function for ABIST error detection. For purposes of illustration, the description illustrates a specific embodiment where the n-bit compare is 10 bits wide and the x-bit valid logic is 2 bits wide.

Figure 1:
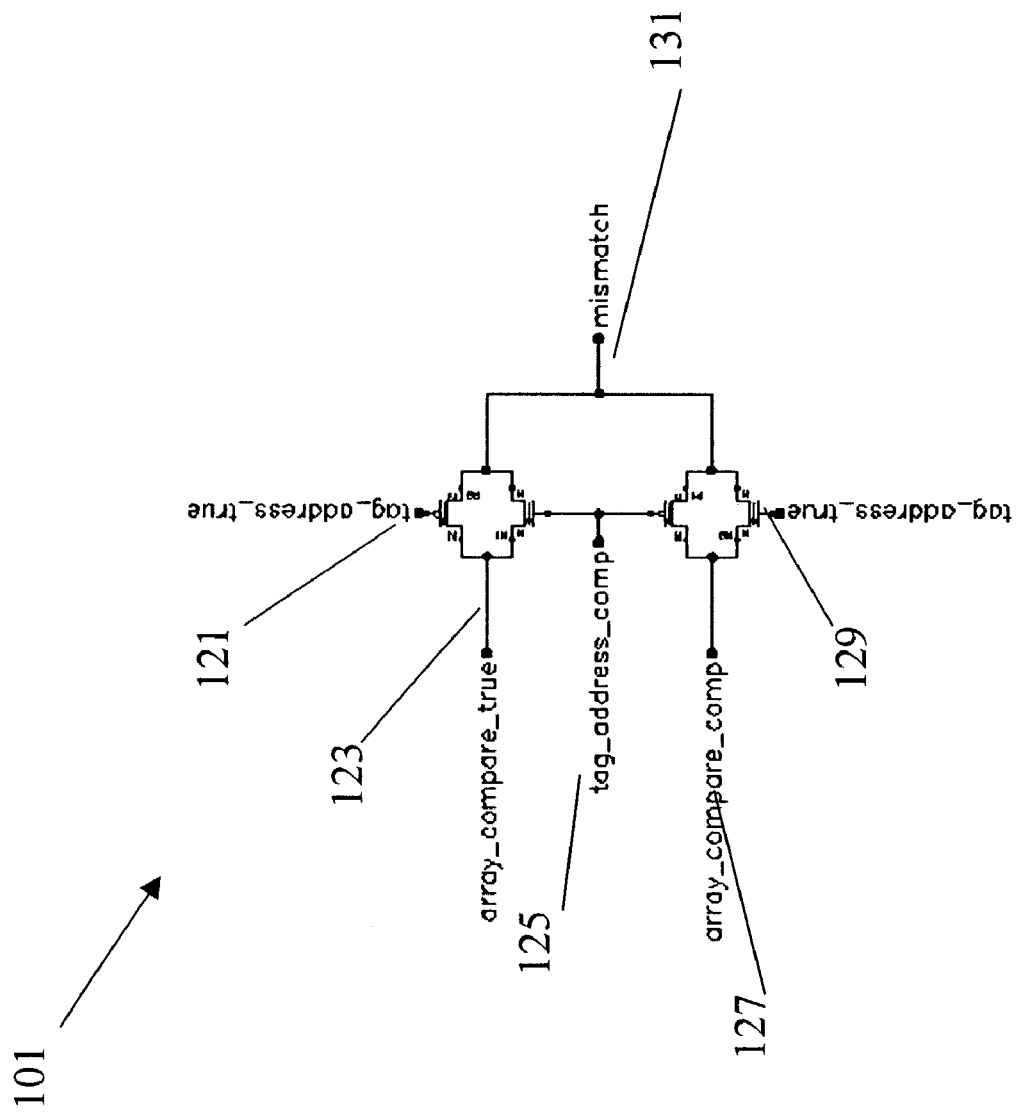
FIG. 1 illustrates an exclusive or ("XOR") function, implemented with pass gate logic, for XOR'ing corresponding array compare bits and tag address inputs and OR'ing the result.

The directory requires a compare function of 10 array bits (array compare bits) with 10 tag address inputs. This compare is then combined with logic based on the value of 2 additional array bits (array valid bits) and 2 tag valid inputs to give an output called, "Hit". The first stage of the compare function was implemented as an exclusive-OR function using pass gate logic shown in FIG. 1. The logic is implemented in circuit, 101, having tag address_true 121, array_compare_true, 123, tag address comp, 125 array_compare_comp, 127, and tag_address_true, 129 returning a mismatch output, 131. The valid logic is defined as (valid=V0U0+V1U1), where V0 and V1 are the array valid bits and U0 and U1 are the tag valid inputs. The circuit, 101, generates a mismatch (0 for match and 1 for mismatch)

output, "Hit." "Hit" is the logical AND'ing of the 10 bit compare result with the valid logic.

Figure 2:
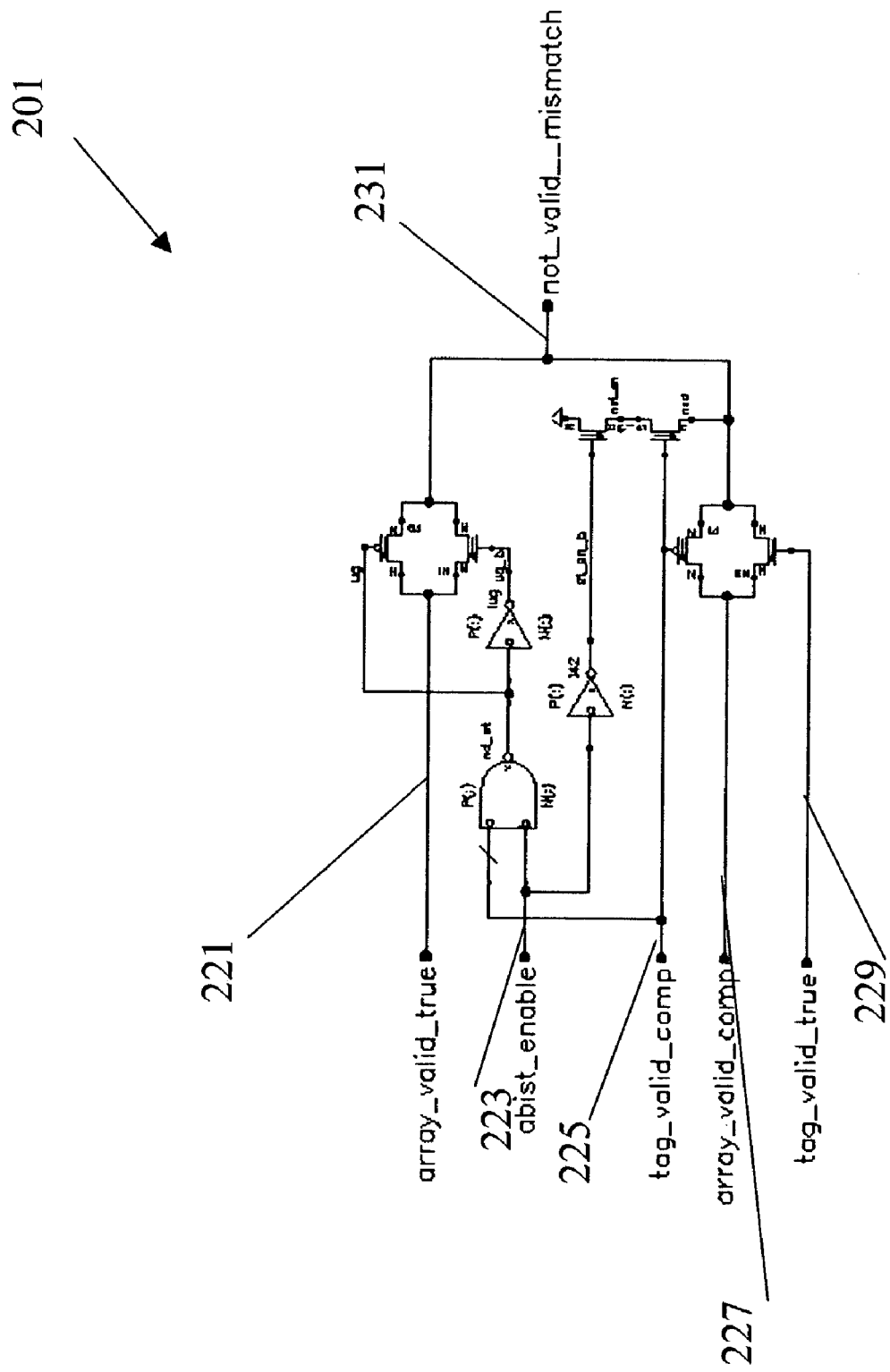
FIG. 2 illustrates an integrated "AND" function for normal operation (abist_control=0) with an "XOR" function for ABIST testing (abist_control=1.)

For the directory, data compression of the 12 array bits (array compare bits plus array valid bits) is required for ABIST error detection and no data outputs are required for the array compare bits. The first stage of the valid logic was implemented such that the state of the ABIST control signal would determine whether the valid logic or an exclusive-OR function was performed. When ABIST control=0, the array valid bits are combined with the tag valid inputs to produce the valid logic. When ABIST control=1, the array valid bits are compared with the tag valid inputs. The 10 bit compare/valid logic function is used in system mode. The 12 bit compare is used by the ABIST macro for error detection during ABIST test. This integrated logic eliminates the need to add data outputs to the array compare bits in order to provide the array data to error detection circuitry in the surrounding logic. FIG. 2 shows the circuit used to implement the valid logic/compare function. The circuit, 201, illustrated in FIG. 2 has array_valid_true 221 abist_enable, 223, tag valid$_{comp}$ 225, $_{array}$_valid_comp, 227, and tag_valid_true, 229, inputs, and a not_valid_mismatch, 231, output.

To complete the system for either compare/valid logic or ABIST error detection, the outputs of these first stages (FIGS. 1 and 2) are logically NOR'ed.

The implemented valid logic uses don't care states in order to simplify the circuitry. In system mode, the tag valid inputs are orthogonal. This gives 4 don't care states. The following truth table shows the defined valid logic (V0U0+V1U1) and the implemented valid logic ((V0+NOT(U0))(V1+NOT(U1))(U0+U1)), with the don't care states noted in Table 1.

While the invention has been described with respect to certain preferred embodiments and exemplifications, it is not intended to limit the scope of the invention thereby, but solely by the claims appended hereto.

TABLE 1

| Array Valid 0 V0 | Tag Valid 0 U0 | Array Valid 1 V1 | Tag Valid 1 U1 | Valid Logic (Defined) | Valid Logic (Implemented) |
|---|---|---|---|---|---|
| 0 | 0 | 0 | 0 | 0 | 0 |
| 0 | 0 | 0 | 1 | 0 | 0 |
| 0 | 0 | 1 | 0 | 0 | 0 |
| 0 | 0 | 1 | 1 | 1 | 1 |
| 0 | 1 | 0 | 0 | 0 | 0 |
| 0 | 1 | 0 | 1 | 0 | 0 (don' care) |

TABLE 1-continued

| Array Valid 0 V0 | Tag Valid 0 U0 | Array Valid 1 V1 | Tag Valid 1 U1 | Valid Logic (Defined) | Valid Logic (Implemented) |
|---|---|---|---|---|---|
| 0 | 1 | 1 | 0 | 0 | 0 |
| 0 | 1 | 1 | 1 | 1 | 0 (don't care) |
| 1 | 0 | 0 | 0 | 0 | 0 |
| 1 | 0 | 0 | 1 | 0 | 0 |
| 1 | 0 | 1 | 0 | 0 | 0 |
| 1 | 0 | 1 | 1 | 1 | 1 |
| 1 | 1 | 0 | 0 | 1 | 1 |
| 1 | 1 | 0 | 1 | 1 | 0 (don't care) |
| 1 | 1 | 1 | 0 | 1 | 1 |
| 1 | 1 | 1 | 1 | 1 | 1 (don't care) |

We claim:

1. A built-in, on-chip test system for testing a memory array for array and tag data, and ABIST error detection, comprising:
   a first subsystem circuit for logically bit-wise ANDing corresponding memory array valid bits and tag valid inputs, generating "0" for a match and "1" for a mis-match, and logically ORing the bit-wise result to generate a "1" hit if there are any bit-wise mismatches;
   a second subsystem circuit for further receiving ABIST control logic as an input to either:
   a. combine array valid bits and tag valid inputs to produce valid output, or
   b. compare array valid bits with tag valid inputs; and
   a logical NOR for outputs of the first and second subsystem circuits, said system implementing an n-bit compare and an x-bit logic function for a SRAM memory directory macro, the where ABIST control logic changes the logic for ABIST error detection.

2. The built in, on-chip test system according to claim 1 wherein in the ABIST mode the tag valid inputs are orthogonal.

3. The built in, on-chip test system according to claim 2 wherein the system produces "don't care" states.

4. The built in, on-chip test system according to claim 3 wherein valid logic is (V0U0+V1U1) where V0 and V1 are array valid bits and U0 and U1 are tag valid inputs.

5. The built in, on-chip test system according to claim 3 wherein valid logic is ((V0+NOT(U0))(V1+NOT(U1))(U0+U1)) where V0 and V1 are array valid bits and U0 and U1 are tag valid inputs.

* * * * *